(12) United States Patent
Illegems

(10) Patent No.: US 6,621,144 B2
(45) Date of Patent: Sep. 16, 2003

(54) DATA RECEIVER GAIN ENHANCEMENT

(75) Inventor: Paul F. Illegems, Albuquerque, NM (US)

(73) Assignee: Koninklijke Philips Electronics N.V., Eindhoven (NL)

(*) Notice: Subject to any disclaimer, the term of this patent is extended or adjusted under 35 U.S.C. 154(b) by 64 days.

(21) Appl. No.: 09/825,974

(22) Filed: Apr. 5, 2001

(65) Prior Publication Data

US 2002/0145158 A1 Oct. 10, 2002

(51) Int. Cl.[7] .............................................. H01L 29/00
(52) U.S. Cl. ...................... 257/533; 257/294; 257/499; 257/528; 257/536
(58) Field of Search ................... 257/294, 499, 257/528, 533, 536; 324/76.45; 455/146, 180.1, 239.1

(56) References Cited

PUBLICATIONS

Sedra/Smith, Microelectronic Circuits, third edition, 1991, pp. 38 and 779.*

* cited by examiner

*Primary Examiner*—Vu A. Le
*Assistant Examiner*—Douglas Menz
(74) *Attorney, Agent, or Firm*—Peter Zawilski

(57) ABSTRACT

An improved data receiver gain enhancement is obtained in circuit by having a V/I converter and an amplifier stage, by placing a passive filter between in converter and amplifier stage. Amplification of certain parts of the signal, more than other parts can be obtained, depending on the characteristics of the filter.

6 Claims, 5 Drawing Sheets

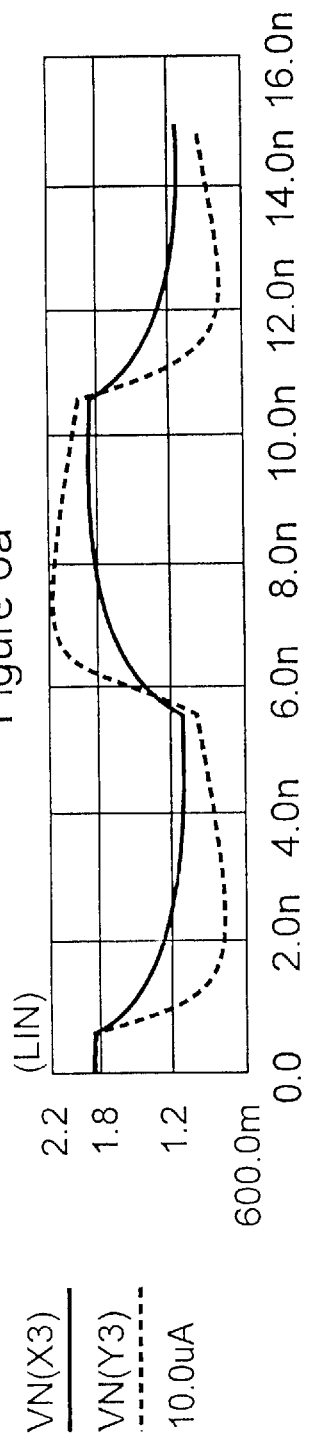
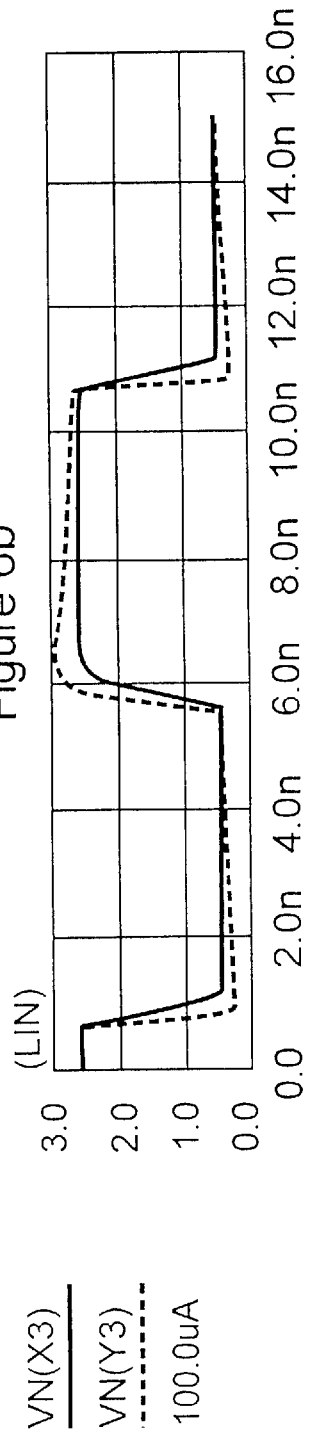
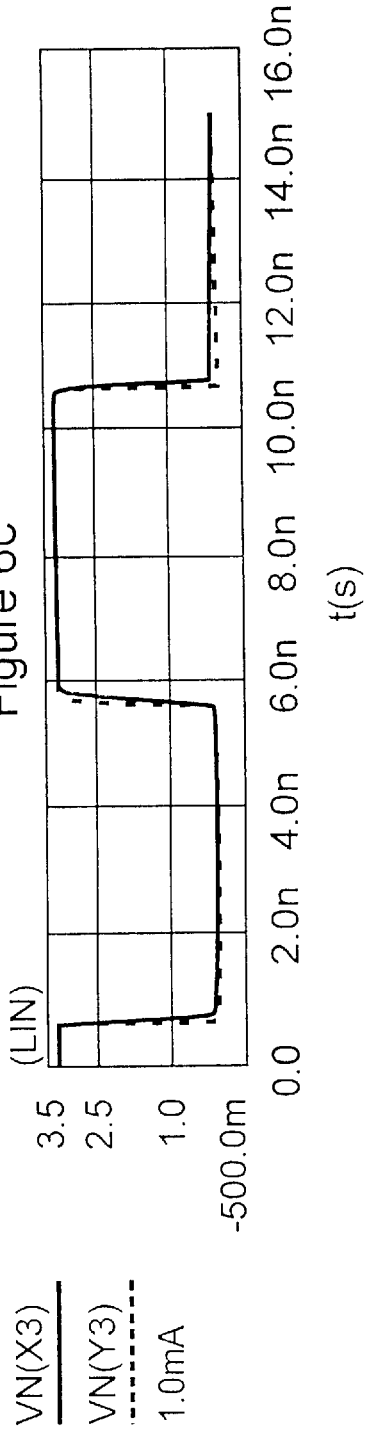

DATA RECEIVER GAIN ENHANCEMENT

This invention relates to gain enhancement, particularly to enhancement of a data receiver circuit for high speed data reception.

BACKGROUND OF THE INVENTION

Amplification is used to amplify incoming signals of variable (small) amplitude to rail-to-rail logic signals. However, variation in signal se can occur, as by losses in the signal path. As a result, the amplified signal can vary in strength.

SUMMARY OF THE PRESENT INVENTION

As stated above, due to various reasons, the input signal can vary in strength, and so the amplified signal varies in strength. In many applications, typical input signals at 400 Mbits/S (2.5 ns bit cell time) have an amplitude of 200 mV, with occasional smaller pulses of <110.mV. Ideally the receiver would always produce full swing output signals with a constant delay, independent of input signal amplitude. By placing a passive filter between the V/I converter and the inverting amplifier stage, it is possible to amplify certain frequencies within the signal more than others, depending on the characteristics of the filter. This enables compensation for losses earlier in the signal path. Thus a device for enhancement of data receiver gain comprises of V/I converter, an amplifier and a passive filter placed between the amplifier and the V/I converter.

BRIEF DESCRIPTION OF THE DRAWINGS

FIG. 6 is a plot of pulse responses;

DESCRIPTION OF THE PREFERRED EMBODIMENT

Figure 1:
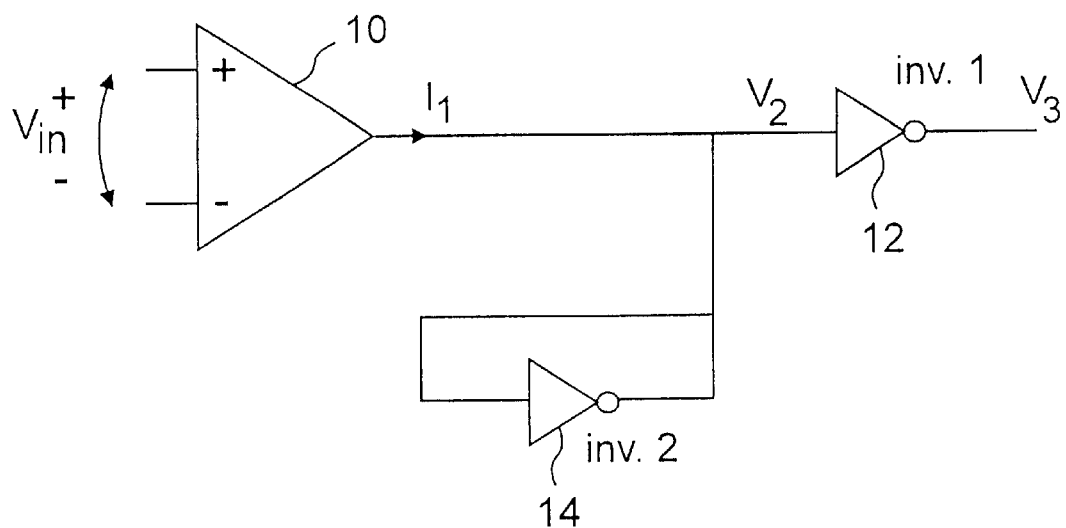
FIG. 1 illustrates an existing circuit.
Figure 2:
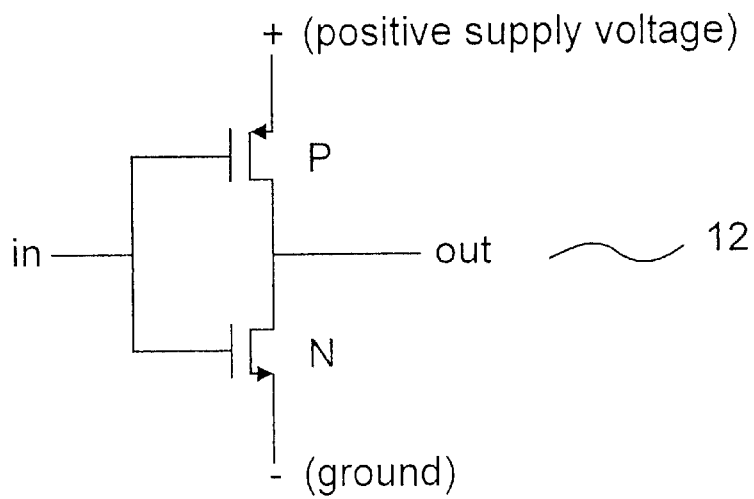
FIG. 2 illustrates the circuitry of an inverter in FIG. 1.

In the circuit in FIG. 1, a first stage, a transconductance amplifier (V/I convertor) converts the input voltage $V_{in}$ to a current I1; this is represented by the current source 30. The output impedance of an inverter inv2, 14, translates I1 again to a voltage V2, driving an amplifier stage inv1, 10. inv1, 10, is a CMOS inverter consisting of a PMOS and an NMOS transistor. The circuit of inv1 and inv2 is illustrated in FIG. 2.

The inverter inv2, 14 is an exact copy of inv1, 12, but with the input and output terminals connected together. Because of the feedback, inv2, 14, will act as a DC voltage source with an impedance determined by the transconductances of its constituting PMOS and NMOS transistors. Since inv2, 14, is matched to inv1, 12, the DC output level of inv2, 14 will be at the optimal operating point for inv1, 12, that is where inv1, 12 has its maximum gain. This configuration is capable of amplification at very high frequencies, up to several hundreds of MHz. The configuration is used in many existing devices.

By placing a passive filter between the V/I converter and the inv1 amplifier stage it becomes possible to amplify or attenuate certain frequencies within the signal more than others, depending on the characteristics of the filter. This way it becomes possible to compensate for losses earlier in the signal path or to apply any other correction of the frequency transfer characteristic.

Figure 3:
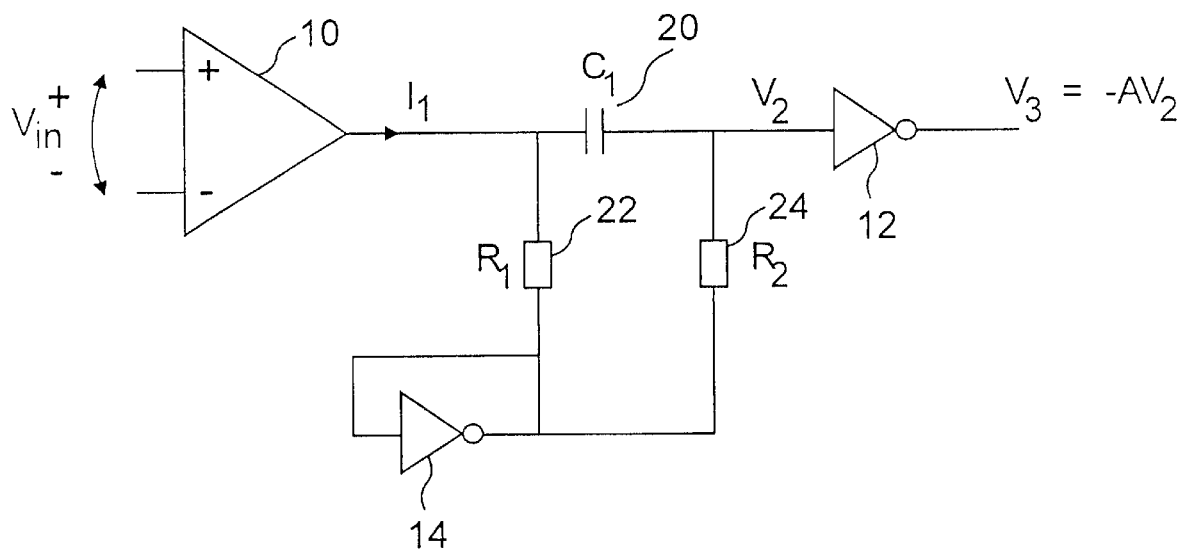
FIG. 3 illustrates a circuit incorporating the present invention.

In the particular embodiment illustrated in FIG. 3, a high pass filter is chosen in order to promote the transitions of the data signal. In FIG. 3 items common with FIG. 2 use the same reference numerals. The filter comprises capacitor 20 and resistors 22 and 24.

Implementation of the high-pass filter with passive components provides a very flexible solution, enabling an optimal placement of the filter pole and zero in order to accommodate to the channel transfer characteristics.

The filter is optionally made with components available in an IC process. Gain improvement of a factor of 2 (6 dB) above a certain frequency, an example 100 MHz, can easily be achieved.

Figure 4:
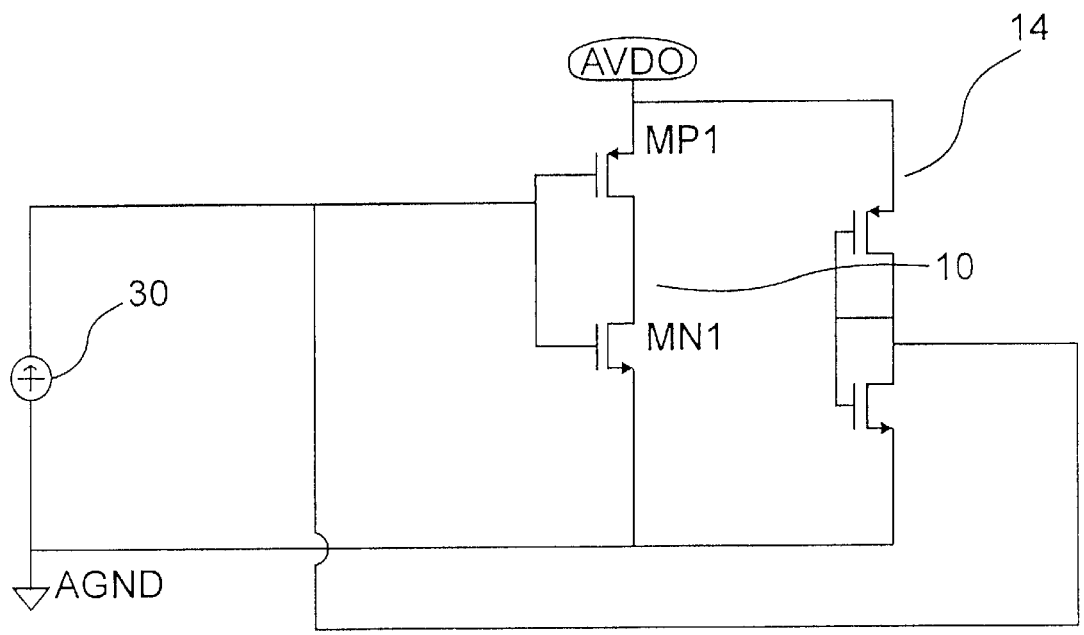
FIG. 4 shows a schematic model for the existing circuit.
Figure 5:
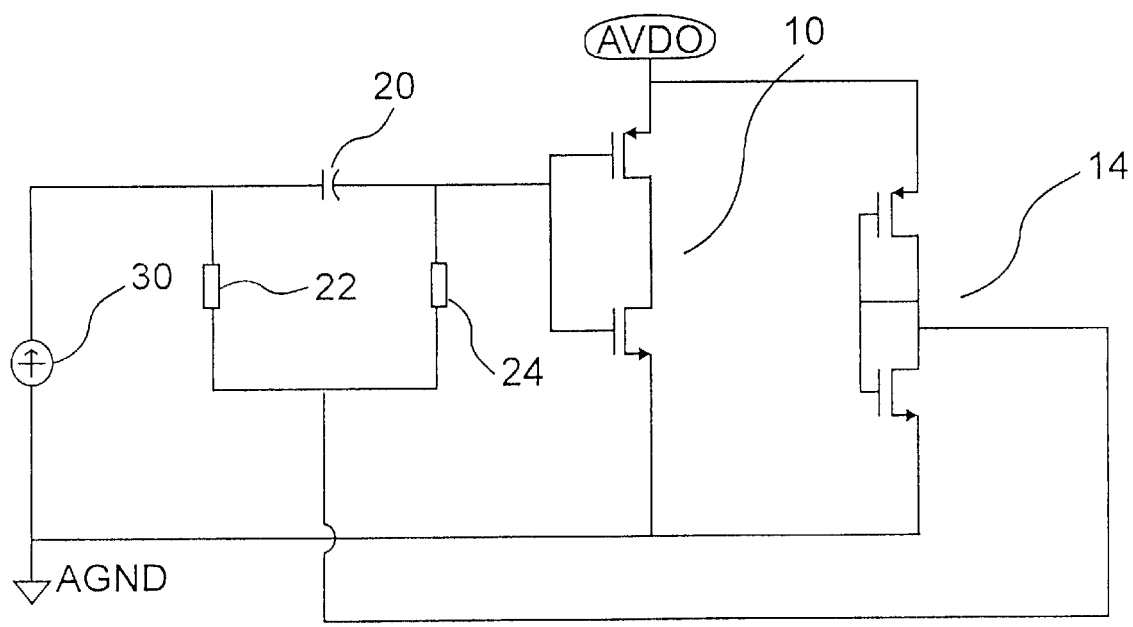
FIG. 5 shows a schematic model for circuit embodying the invention.

FIGS. 4 and 5 show schematic models for the previously known (FIG. 4) and the new circuit in accordance with the invention (FIG. 5). Both have a current source, 30, representing the input signal. These sources 30, J-X and J-Y, produce the same signals.

The pulse responses are plotted in FIG. 6. At small levels of the input signal the output signal amplitude is considerably increased—the increased signal being seen at the dotted line—as seen in FIG. 6A. The relative increase becomes smaller for larger signal amplitudes, as in FIG. 6B and FIG. 6C, due to the non-linear characteristic of the inverter amplifier. This is desirable, as it is observed tat the filter works for small input signals.

Figure 7:
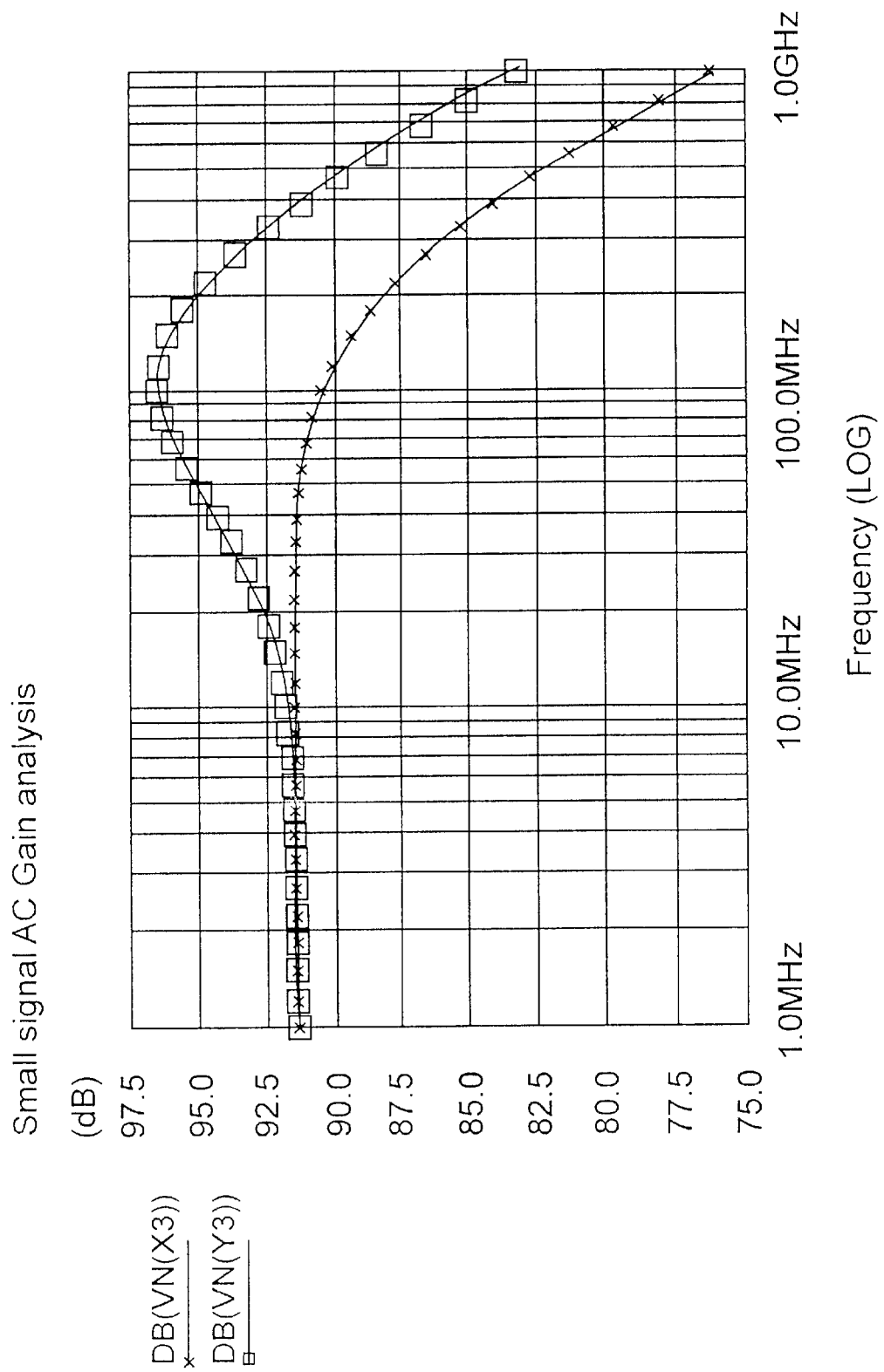
FIG. 7 illustrates a gain increase.

In the frequency domain, FIG. 7 shows a greater than 6 dB gain increase at beyond 100 MHz signal frequencies, up to >1 GHz for this particular filter.

Although in the above embodiment, a high pass filter is shown, a low pass filter used for de-emphasis and noise reduction is also possible.

Numerous other embodiments may be envisaged without departing from the spirit or scope of the invention. For example, a NAND gate may be used in place of the inverter. Further, different types of filters are useful with the invention; a passive filter was chosen in the preferred embodiment due to its simplicity and adequacy for the design.

What is claimed is:

1. A gain enhancement circuit, comprising:
   a transconductance amplifier having a pair of input terminals and an output terminal;
   an inverting circuit stage having an input terminal and a output terminal; and
   a filter circuit having an input terminal coupled to the output terminal of the transconductance amplifier, and having an output terminal coupled to the input terminal of the inverting circuit stage;
   wherein the filter circuit comprises a first inverter having an input terminal and an output terminal, the input and output terminals coupled to each other; a first resistor and a second resistor, each resistor having respective first and second terminals, the first terminal of each of the first and second resistors coupled to the output terminal of the first inverter; a capacitor having first and second terminals, the first terminal of the capacitor coupled to the second terminal of the first resistor, and the second terminal of the capacitor coupled to the second terminal of the second resistor.

2. The gain enhancement circuit of claim 1, wherein the input terminal of the filter circuit corresponds to the node formed by the first terminal of the capacitor and the second terminal of the first resistor, and the output terminal of the filter circuit corresponds to the node formed by the second terminal of the capacitor and the second terminal of the second resistor.

3. The gain enhancement circuit of claim 2, wherein the inverting circuit stage and the first inverter are each comprised of at least one PMOS transistor and at least one NMOS transistor, and wherein each of the inverting circuit and the first inverter are coupled a first power supply node, and to a ground node.

4. The gain enhancement circuit of claim 3, wherein the inverting circuit stage comprises an inverter.

5. The gain enhancement circuit of claim 3, wherein the inverting circuit stage comprises a circuit selected from the group consisting of a NAND gate and a NOR gate.

6. The gain enhancement circuit of claim 3, wherein the first inverter and the inverting circuit stage are each identically configured.

* * * * *